United States Patent
Betawar et al.

(10) Patent No.: US 7,958,422 B2
(45) Date of Patent: Jun. 7, 2011

(54) METHOD AND APPARATUS FOR GENERATING SELF-VERIFYING DEVICE SCENARIO CODE

(75) Inventors: Manoj Betawar, Fremont, CA (US); Dinesh Goradia, Fremont, CA (US)

(73) Assignee: Sapphire Infotech, Inc., Fremont, CA (US)

( * ) Notice: Subject to any disclaimer, the term of this patent is extended or adjusted under 35 U.S.C. 154(b) by 0 days.

(21) Appl. No.: 12/626,916

(22) Filed: Nov. 29, 2009

(65) Prior Publication Data

US 2010/0122235 A1   May 13, 2010

Related U.S. Application Data

(63) Continuation-in-part of application No. 12/338,065, filed on Dec. 18, 2008, now Pat. No. 7,661,053, which is a continuation of application No. 11/277,614, filed on Mar. 27, 2006, now Pat. No. 7,478,305.

(60) Provisional application No. 61/118,634, filed on Nov. 30, 2008.

(51) Int. Cl.
*G01R 31/28* (2006.01)

(52) U.S. Cl. ........................................................ 714/742

(58) Field of Classification Search .................. 714/724, 714/738, 742
See application file for complete search history.

(56) References Cited

U.S. PATENT DOCUMENTS

| | | | | |
|---|---|---|---|---|
| 6,047,393 | A * | 4/2000 | Yamada | 714/718 |
| 7,139,955 | B2 * | 11/2006 | Rohrbaugh et al. | 714/738 |
| 7,257,754 | B2 * | 8/2007 | Chae et al. | 714/738 |
| 7,284,177 | B2 * | 10/2007 | Hollander et al. | 714/739 |
| 7,302,623 | B2 * | 11/2007 | Kang | 714/718 |

* cited by examiner

*Primary Examiner* — James C Kerveros
(74) *Attorney, Agent, or Firm* — Rajeev Madnawat; Michael Toback

(57) ABSTRACT

Methods and systems for generating code for a device are disclosed. A device command for which the code is to be generated is selected. Response template parameters for the selected device commands are retrieved from a response template associated with the device command. Command syntax for the selected device commands are retrieved from a device library associated with the device command. The code is generated for the device in a high level language and the response template parameters are incorporated to provide verification of the device response when the test code is executed.

18 Claims, 5 Drawing Sheets

METHOD AND APPARATUS FOR GENERATING SELF-VERIFYING DEVICE SCENARIO CODE

CLAIM OF PRIORITY AND RELATED APPLICATIONS

This application claims the benefit of U.S. Provisional Application No. 61/118,634 filed on Nov. 30, 2008 entitled "Method and Apparatus for Generating Self Verifying Device Scenario Code". This application is a continuation-in-part of U.S. application Ser. No. 12/338,065 filed on Dec. 18, 2008 entitled "Methods and Apparatus for Patternizing Device Responses", now U.S. Pat. No. 7,661,053, which is a continuation of U.S. application Ser. No. 11/277,614, filed on Mar. 27, 2006, entitled "Method And Apparatus For Interactive Generation of Device Response Templates", and issued as U.S. Pat. No. 7,478,305 on Jan. 13, 2009. All of these applications are being incorporated herein by reference.

BACKGROUND AND DESCRIPTION OF THE RELATED ART

In creating a communication scenario, a device would be selected, then a command is selected from the known set either from knowledge or the documentation accompanying the device, and commands are sent to the device with appropriate parameters. Each response is then compared against some known or assumed response format. More commands can be entered if need be, until the last command is entered. At that point, the list of commands to be generated can be manually created or saved if recorded and edited, then referenced by a scenario identifier.

In the available products, a sequence of commands can be recorded, but this sequence does not relate to the known set of commands for that device or a specified result template or equivalent for the response. If code can be generated, it does not include self-verification of command responses when code is executed.

BRIEF DESCRIPTION OF THE DRAWINGS

A better understanding of the present invention can be obtained from the following detailed description in conjunction with the following drawings, in which.

Figure 1:
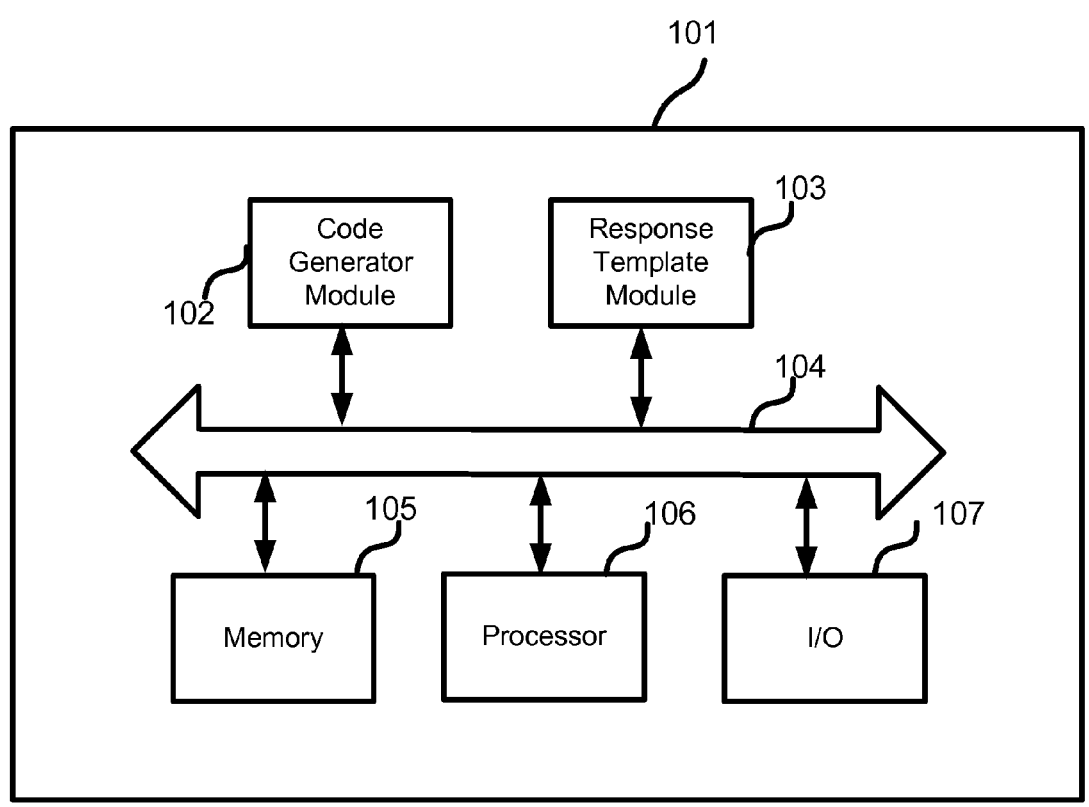
FIG. 1 illustrates the architecture of a code generator apparatus in accordance with one or more embodiments.

The figures are provided in order to provide a thorough understanding of the present invention. The figures should not be construed as limiting the breadth of the invention in any manner.

SUMMARY

In one embodiment, a method for generating code for a device under test (DUT) is disclosed. A device command for which the code is to be generated is selected. Response template parameters for the selected device commands are retrieved from a response template associated with the device command. The code is generated for the DUT in a high level language and the response template parameters are incorporated to provide verification of the device response when the code is executed.

In another embodiment, a computer readable medium containing instructions for generating code for a DUT is disclosed. A device command for which the code is to be generated is selected. Response template parameters for the selected device commands are retrieved from a response template associated with the device command. The code is generated for the DUT in a high level language and the response template parameters and execution platform information are incorporated to provide verification of the DUT response when the code is executed.

In another embodiment, an apparatus for generating executable code associated with a DUT is disclosed. The apparatus includes a computer coupled to the device, storage for a device library and response templates coupled to the computer, storage for scenarios coupled to the computer, storage for commands coupled to the computer, a graphical user interface, and a code generator. The graphical user interface is used to create, retrieve, and store a device library; send a command to a DUT; display the device response; associate a command template with a response template; associate a command template with a scenario; select each of the fields in the response template; and associate rules with each field in the response template. The code generator is coupled to the computer, and is used to generate executable code associated with the command template, response template, and the rules associate with the response template.

DETAILED DESCRIPTION

As used herein, the term "device under test" (DUT) describes either a single device or a group of devices coupled together.

As used herein, the term "device library" describes a set of device parameters necessary to connect and communicate with a physical or logical device. One embodiment of this would be a data structure which stores the address, protocol, parsing methodology and prompts associated with a particular device. The prompts associated with a device are the strings which tell the program receiving a response from the device that the response is complete. The device library contains a set of blocks of information. Each block contains a set of attribute names (such as IP Address, port, enabled ports, disabled ports, etc.) for a specific DUT. The set of attributes could be different for different devices. Interacting with the system through a unified user interface provides values for these attributes during the process of generating a scenario library for the DUT. Existing device libraries are stored in persistent data storage such as database or file system. If a device library already exists for a similar device (i.e. same device, different address), it may be selected then initiate the create device menu function to display the device attributes and modify it. Once it has been modified it can be saved under the current device name or a new name.

As used herein, the term "scenario" refers to a sequence of steps where at each step, communication is initiated to a device and responses can be validated against a range of expected responses at each step. One embodiment of this would be a test case. Another embodiment would be a system calibration process.

As used herein, the term "response template" describes an apparatus which is essentially a pattern matching tool that is used to extract variable values from device responses. The goal of the response template is to provide a way of defining references to values contained in the response without having to write code and rebuild the scenario every time it changes. The template can be used to generate a list of header information to enable a software program to determine whether the response from the device is valid, one or more markers which are a fixed string within the response that can be used to find values within a block of text, a list of blocks of a specific structure, and a list of variables contained in those blocks of a specific type. Multiple templates can be defined for a given command response, based on the blocks and variables defined. A specific response template can be used to extract values from the response to a command and those values can be used in subsequent steps of a scenario.

As used herein, the term "command template" is a generic representation of some command that, when associated with a specific device library will create a command that is specific to that device type. For instance, all devices may support a "ping" command, but the syntax may vary depending on the type of device. The use of a command template allows a user to associate that command with one or more steps of a scenario without having to know the different syntaxes for each device.

The association of the command template to a device library and the response template to the command template can be used to generate code that can be executed on a computing device. For instance, if the syntax associated with a ping command for a particular device requires the word "PING" followed by a comma followed by the IP Address of the device, one can use this to generate code in any one of several high level languages (TCL, Java, BASIC), that can send strings across a network to a specified IP address and accept a response. The accepted response can be compared to the format and value typing associated with the response template to provide some level of validation. Code can then be generated to verify that strings are present in the response at certain locations in the command response. This code is then contains code to validate the responses received from the DUT In one or more embodiments, the process of validation of the expected command response is defined by associating rules with the response template in its context of this scenario step. Rules can be relatively simple, such as validating that a particular string must be a value of a particular format or a fixed-value. For instance a date time stamp of the format "mm/dd/yyyy hh:mm:ss" or a floating point value. The rule can get more complex such as defining an absolute range for the value. The rule can also specify a dependency on another value, such as stating that the value that must be greater than some value in a prior step within the scenario, or some value globally defined within the scenario. In that sense, a rule can be formula-driven. In one or more embodiments, defining such complex rules utilizes a UI which allows the selection of a particular field within the response template and then to create one or more rules that can be associated with the particular field. In the validation step within the code, the rules would be converted to value comparisons.

FIG. 1 shows the basic architecture for one or more embodiments of an apparatus which can be used to generate code which is self-verifying against the responses to commands. A computer 101 would generally consist of memory 105, one or more processors 106 and a plurality of I/O modules 107. These modules would communicate with each other over a bus 104. Running on the computer at a minimum would be a sequence of software commands that embody a code generator module 102 and a response template module 103.

The code generator module 102 and response template module 103 interoperate in order to generate code based on the response template data.

Figure 2:
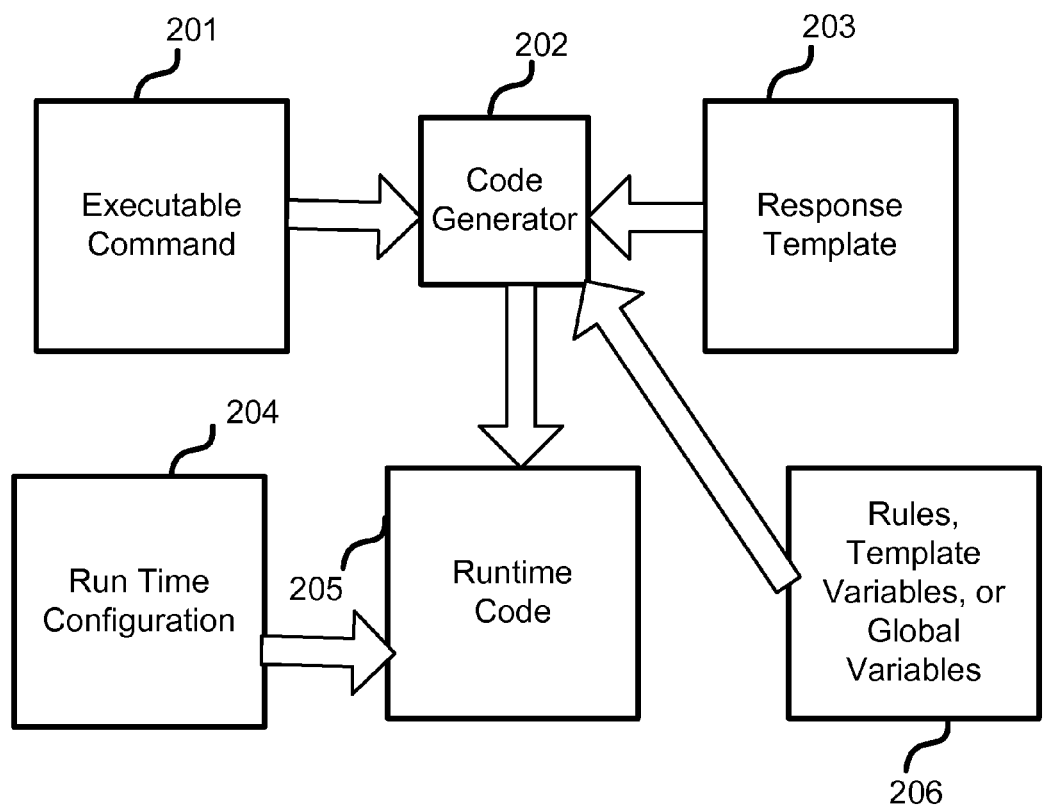
FIG. 2 illustrates a flow diagram of generating code for a device in accordance with one or more embodiments.

FIG. 2 shows a more detailed view of how the two functional processes that are used in one or more embodiments interact to create an association between a command and response template using rules or variables and generate the code according to this association. The executable command 201 executes and a response template 203 is created. In another embodiment, a response template can be created via a text editor based on the DUT specification of how it responds to a specific command. Each field within a response template 203 may be associated with one or more rules 206. A rule 206 is a statement that gets compiled in with the response and command template that tells the code generator how to generate code to validate a field in a response template. In a response template 203, a string is just a string, maybe with a pattern associated with it, but just a string. With the rule 206, the string can be interpreted as a specific type, compared to some fixed value, compared to some other value within the response template, or compared to some other value in another template such as one associated with the executable command 201, a variable on another response template, or a variable defined globally to the environment. Once the rule is associated with the response template, it can be used by the code generator 202 to generate validation steps which then uses it to say whether the step succeeded or failed and why. In one embodiment, the default code that is generated is in an internal XML format that then can be converted to JAVA™, TCL, or other executable languages. In one or more embodiments, the code generator can generate code in a high-level language, the high-level language including compiled languages such as JAVA™, C, or C++, and scripting languages such as TCL or JavaScript. Once the template is converted to runtime code 205 via the code generator 202, it can be executed by a run-time environment 204 associated with the device.

Figure 3:
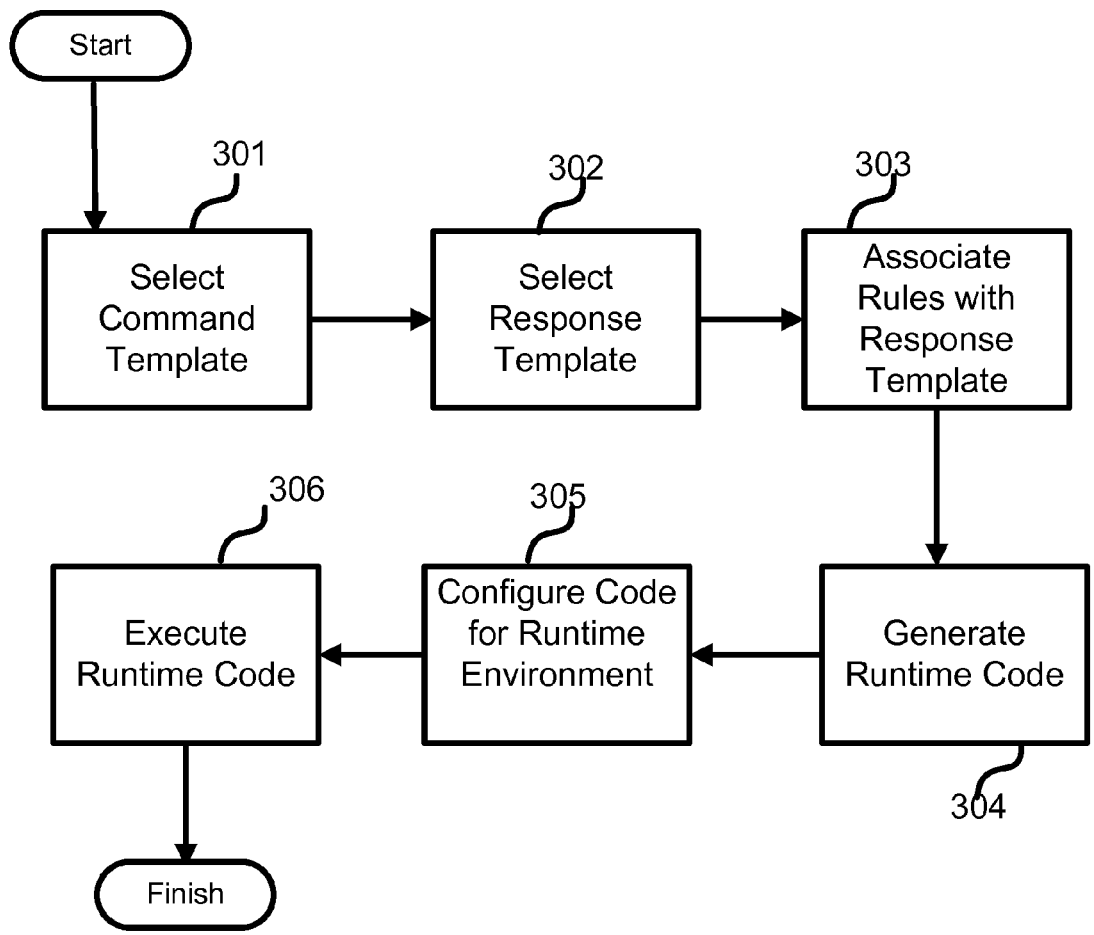
FIG. 3 shows a flow diagram of generating code through a response template and executing it in accordance with one or more embodiments.

FIG. 3 shows the process flow of generating device code in one embodiment. At steps 301 and 302 respectively, the command template is selected along with its associated response template. In one example, the selection of a command template includes selecting a command that is executable by a device. In another embodiment, the selection of a command template includes finding a command that is executable by a device for a selected command. At step 303, the response template is then associated with rules for this particular step. Once these associations are defined, at step 304, the code generator generates runtime code. In one embodiment, the process of generating code ends at step 304. In another embodiment, the generated code is then executed by a connected device. In one embodiment, the generated code is transferred to a test framework, which connects to the device that executes the generated code. When the step is ready to execute, at step 305, the runtime configuration for the runtime platform is used to deploy the code to the proper platform, and at step 306, the runtime code is executed. As part of this execution, messages are sent to and received from the DUT, and interpreted by the runtime code in the context of the rules.

The following example illustrates association of data in the response template with a command response in a self verifying code. A command template is executed for a ping command that accepts a single parameter, an IP address. The response template has two fields; an IP address 15 characters long, with a single space between that and a four character field that is either "OK" or "FAIL". The IP address associated with the command template is stored in a global variable named % IP_ADDRESS %. One rule is associated with each field. The first field rule is that the string must be equal to the %IP_ADDRESS% variable. The second field rule is that the field must be equal to "OK" (OK followed by two spaces). In one embodiment, the XML representation of the executable code is:

```
<code>
    <network_cmd>ping %IP_ADDRESS%</network_cmd>
    <response_field><start>0</start><end>14</end>
    <rule><value>%IP_ADDRESS%</value>
        <operation>EQUALS</operation>
    </rule></response_field>
    <response_field><start>16</start><end>19</end>
    <rule><value>OK </value>
    <operation>EQUALS</operation>
    </rule></response_field>
</code>
```

In another embodiment, the executable code in JAVA™ is:

```
void ping_device(string IPAddress) throws response_fail_exception
{
    net.createConnection(IPAddress);
    String response = net.sendCommand("ping " + IPAddress);
    String field1 = response.substring(response_field[field1].start,
      response_field[field1].end);
    if(field1.equals(getVariable("IP_ADDRESS)))
      throw new test_fail_exception(field1);
    String field2 = response.substring(response_field[field2].start,
      response_field[field2].end);
    if(field2.equals("OK "));
      throw new response_fail_exception(field2);
    return;
}
```

In the above example, the content of the network_cmd tag in xml and the net.sendCommand call in Java were derived from the device template library associated with the command. The response field definition in XML and the if statement in java represent the processing around the response template, including the rules associated with a field.

Figure 4:
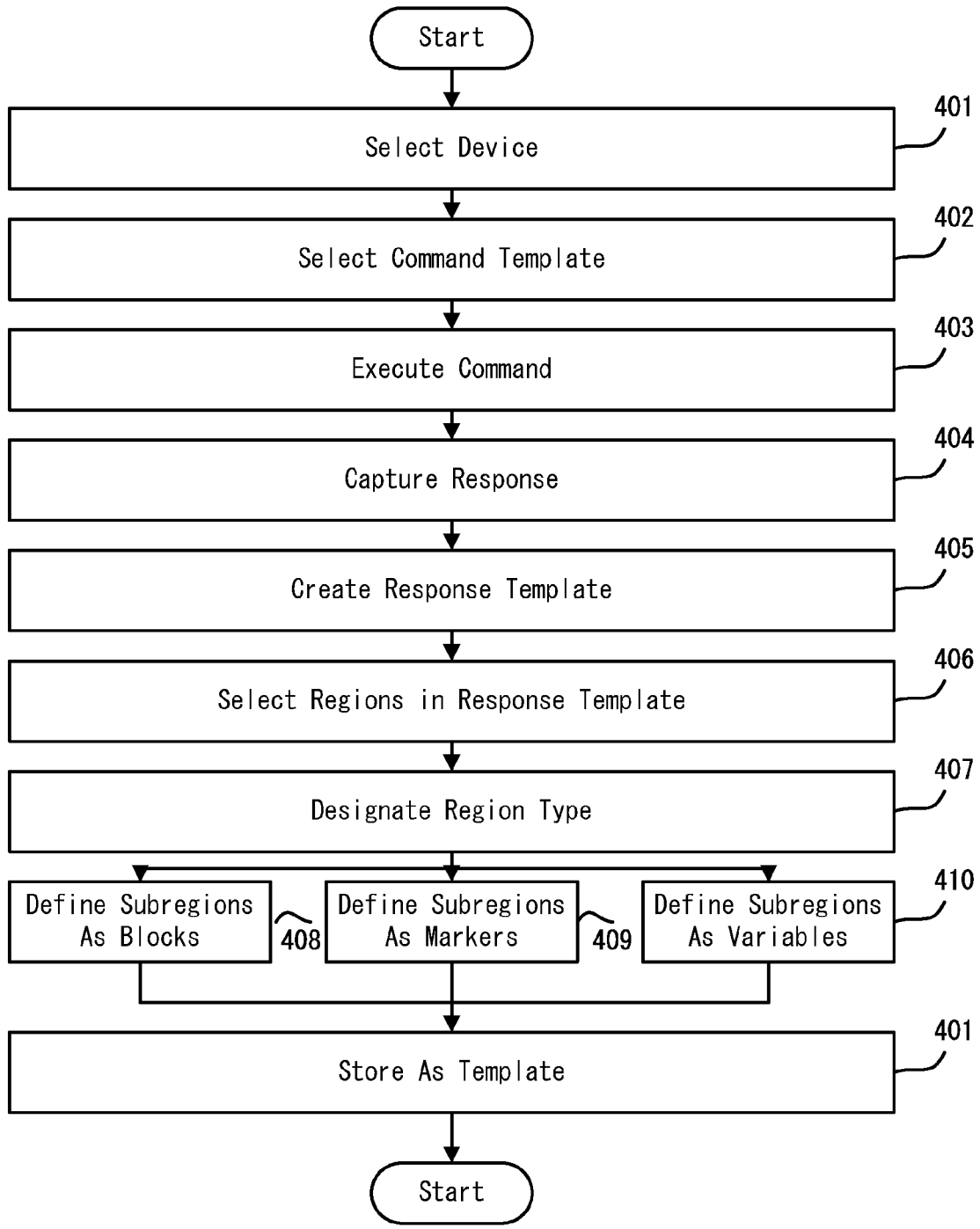
FIG. 4 shows a flow diagram of creating a response template in accordance with one or more embodiments.

FIG. 4 illustrates exemplary flowchart for creation of a response template. At step 401, a device is selected from one or more of the existing device libraries. In one embodiment, device libraries are stored in persistent data storage such as a database or file system. After a device library has been selected, a connection to the device is established. In one embodiment, the connection is established through a telnet-like session with the device. In one or more embodiments, this can be displayed as a scrollable display showing the past and current commands and the displayed response. In one or more embodiments, the telnet session can emulate some specific terminal interface.

In step 402, a command template may then be selected. In one embodiment, prior to sending the command to the device, the command is parsed using the parsing algorithm specified for the device. The algorithm used to separate the command from its parameters is dependent upon the shell being used. In one embodiment, a regular expression parser is used to separate out the separator characters like spaces and commas from the command and parameter values. At step 403, the command is executed at a device and at step 404, the response is captured. In one embodiment, the response is captured in a text format in which each character in the device response is addressable by a line number and column number.

A data structure called the response buffer stores the previous response. At step 404, a response template can be initialized with the captured response and at step 405, the response is associated with the command template. In one or more embodiments, associations among device library, processing step, command and response templates are persistently stored.

Patterns are identified in the data that can be used to extract the values of interest. At step 406, regions of the command response are selected and at step 407, the selected regions are designated as blocks. In one or more embodiments, this is done with an appropriate pointing device such as a mouse. At step 407, a type of the selected block is designated. The type of the selected block includes command, prompt, free format, table, etc. In one or more embodiments, regions within those blocks are then selected using the same pointing device and designate those subregions either as block, markers or variables, at steps 408, 409 and 410 respectively. Blocks are regions of the display that contain other data structures. The current definition of a data structure includes tables, line tables, and free format areas, but can also include a web service response (html or xml marked up stream), binary formatted data, and any parsable string of bytes. A table is a region which contains multiple rows and columns of data. A line table is a table which consists of a header and a single row of data, which may extend to multiple lines. A free format region enables one to select an area of text that has no form or format except to consist of contiguous characters. One can then define markers in the free format region to allow a scenario step to locate a variable value in the free format region.

By adding new format types and appropriate substructures, the definition of a block can be expanded to include any data structure that can be represented as a text stream. For instance, an html string is just a stream of characters such that it only makes sense to select specific subblocks; regions which start and stop with the same tag at the same level. Or, it is possible to represent a binary stream as a pair of hex values for each byte, making sure that one cannot define a region by splitting a byte; i.e must always start and stop on an even boundary. More complex binary structures would require more complex parsing, search and subregion definitions. Markers are strings that are used to align the search for a variable. It is assumed that the next non-whitespace value after the end of the marker is a variable. A variable is defined in a template by mapping a name and format to a specific area in the command response and assigning a data type. Defining variables in the response template allows the user to retrieve specific values from the response of the command during run-time testing. Variables may have types and ranges associated with them. Other embodiments may designate other kinds of subregions as well. Once the template definition is complete, at step 411, the template definition is stored in a data store.

Figure 5:
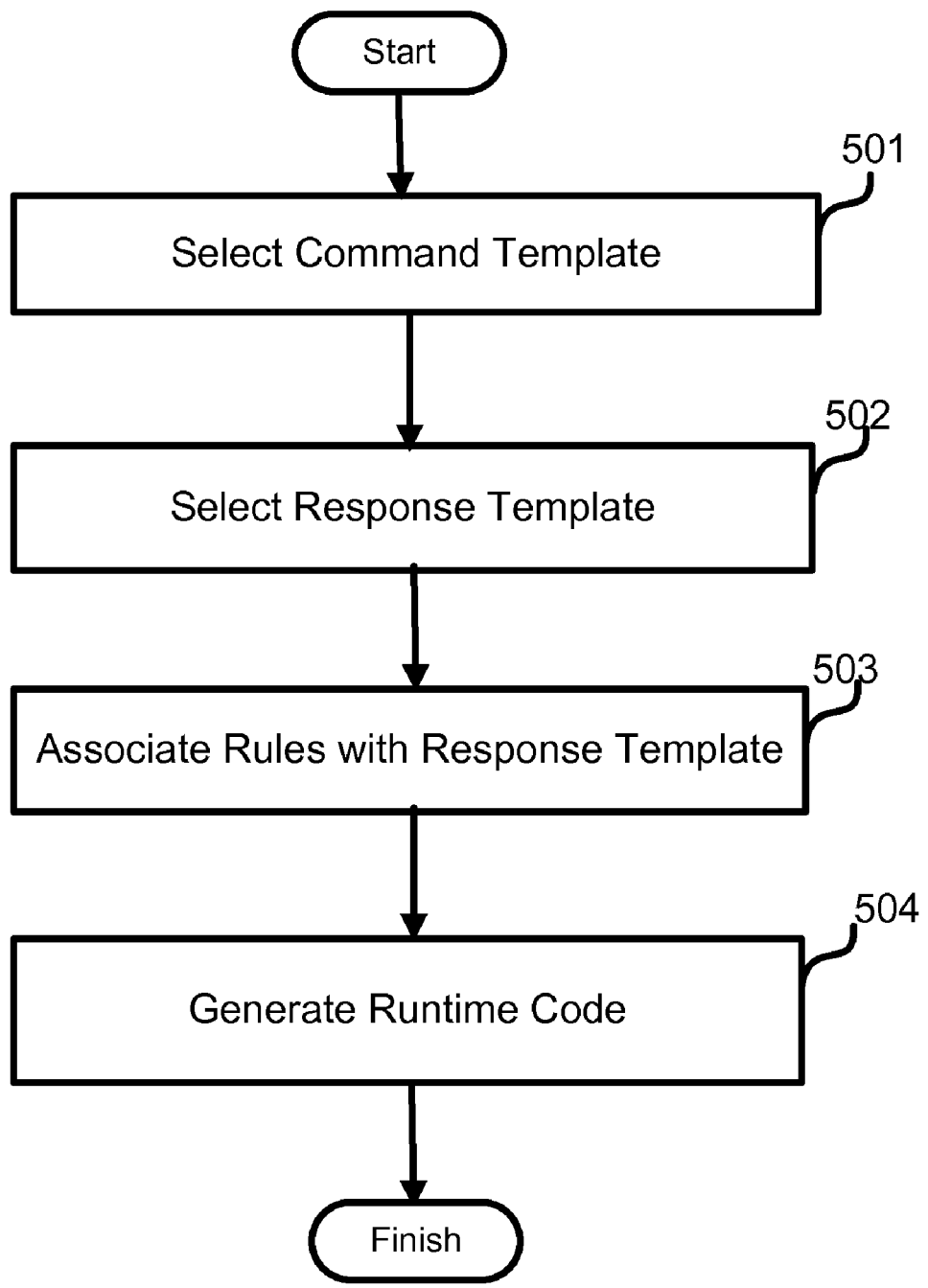
FIG. 5 shows a flow diagram of generating code through a response template in accordance with one or more embodiments.

FIG. 5 shows the process flow that can be used in one or more embodiments to generate code from a command and response template. At step 501, a command template is selected to be used to generate a command to be sent to the particular DUT. At 502, a response template to be associated with the command template is selected. At step 503, one or more rules can be associated with the response template for this particular step. Each of these rules are associated with one or more fields on a response template. At step 504, once this step definition is complete, the code generator can generate associated runtime code. In one or more embodiments, the generated code consists of essentially three different sections. First the command is sent to the device. This uses the device library, command template, and parameters associated with the command template. In one or more embodiments, this may require initialization based on configuration associated with the runtime platform and the device itself. Second, the response is captured, the code generated for this section uses the response template to take the response text stream and format it according to the response template, such that the appropriate bytes in the text stream are placed into the appropriate structure for the field. Third the response is validated, based on the association of the fields in the response template to the rules. In one or more embodiments, the order of the rule validation may be simply based on a combination of the ordering of the fields within the response template then the order of creation of the rules within the field. In another embodiment, the order of the validation can be set on each rule, as well as whether the response will be a warning, error, or scenario-ending action should the validation fail.

The code generator, in one or more embodiments, is configurable to adapt to generate code in a selectable format or language. For example, the code generator is capable of generating code that is suitable to be executed in one or more device testing frameworks. In one embodiment, the code generator generates TCL scripts. In another embodiment, the code generator generates JAVA™ scripts. In yet another embodiment, the code generator can generate code in any format and in any high level language so long as the format information is inputted in the configuration of the code generator.

In one or more embodiments, programming instructions for executing above described methods and systems are provided. The programming instructions are stored in a computer readable media.

With the above embodiments in mind, it should be understood that one or more embodiments of the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of one or more embodiments of the invention are useful machine operations. One or more embodiments of the invention also relates to a device or an apparatus for performing these operations. The apparatus may be specially constructed for the required purposes, such as the carrier network discussed above, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The programming modules and software subsystems described herein can be implemented using programming languages such as Flash, JAVA™, C++, C, C#, Visual Basic, JavaScript, PHP, XML, HTML etc., or a combination of programming languages. Commonly available protocols such as SOAP/HTTP may be used in implementing interfaces between programming modules. As would be known to those skilled in the art the components and functionality described above and elsewhere herein may be implemented on any desktop operating system such as different versions of Microsoft Windows™, Apple Mac™, Unix/X-Windows™, Linux™, etc., executing in a virtualized or non-virtualized environment, using any programming language suitable for desktop software development.

The programming modules and ancillary software components, including configuration file or files, along with setup files required for providing the method and apparatus for troubleshooting subscribers on a telecommunications network and related functionality as described herein may be stored on a computer readable medium. Any computer medium such as a flash drive, a CD-ROM disk, an optical disk, a floppy disk, a hard drive, a shared drive, and storage suitable for providing downloads from connected computers, could be used for storing the programming modules and ancillary software components. It would be known to a person skilled in the art that any storage medium could be used for storing these software components so long as the storage medium can be read by a computer system.

One or more embodiments of the invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

One or more embodiments of the invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

While one or more embodiments of the present invention have been described, it will be appreciated that those skilled in the art upon reading the specification and studying the drawings will realize various alterations, additions, permutations and equivalents thereof. It is therefore intended that embodiments of the present invention include all such alterations, additions, permutations, and equivalents as fall within the true spirit and scope of the invention as defined in the following claims. Thus, the scope of the invention should be defined by the claims, including the full scope of equivalents thereof.

What is claimed is:

1. A method for generating scenario programming code, in a high level language, for a device under test (DUT), the method comprising:
   a. receiving a command selection including a device command
   b. retrieving a device library for the received device command, wherein the device library includes a command syntax for an execution of the device command by the DUT, wherein the command syntax conforms to the high level language;
   c. retrieving response template parameters for the device command, the response template parameters being retrieved from a response template of the device command, the response template includes definitions of fields in a command response, a plurality of command responses and verification rules associated with one or more fields; and
   d. generating the scenario programming code to execute the device command, wherein the scenario programming code being generated using the command syntax defined in the device library, the generated scenario programming code includes programming instructions to verify the command response using the verification rules and one or more of the plurality of command responses, at runtime, wherein the response template further includes a location of a pattern of parameters within a plurality of parameters in the command response, the pattern of parameters includes information defining dimensions of the pattern of parameters.

2. The method as recited in claim 1, wherein the verification of the command response is encoded in the programming code using a command response information in the response template.

3. The method as recited in claim 1, wherein the verification rules include at least one of "compare with a fixed value," "within a range," and "formula driven".

4. The method as recited in claim 1, wherein the programming instructions to verify includes programming code for using the verification rules associated with at least one of fields to compare the plurality of command responses with an actual result received from the DUT, and returning a status indicator based on the comparison.

5. The method as recited in claim 1, wherein the high level language includes at least one of a compiled language or a scripting language, wherein the compiled language includes at least one of C, C++, and Java, and the scripting language includes at least one of PHP and JavaScript.

6. The method as recited in claim 1, wherein the generating includes retrieving information of an execution platform.

7. The method as recited in claim 6, wherein the selection of a high level language is determined by the information of the execution platform, wherein the high level language being supported by the execution platform.

8. An apparatus for generating executable programming code associated with a device under test (DUT) for a selected runtime environment, the apparatus comprising:
  a computer, the computer comprising at least one CPU and a memory;
  a response template storage coupled to the computer to store a response template associated with a command;
  a device library storage coupled to the computer for storing command syntax of commands associated with each type of DUT;
  a code generator module coupled to the computer;
  wherein the computer is configured to receive a selection of commands retrieve response template parameters associated with a command from the response template storage, retrieve the command syntax associated with the command from the device library storage; and the code generator module configured to generate the programming code in a high level language using the response template parameters and incorporating verification of a response of the command response when the programming code is executed,
  wherein the response template further includes a location of a pattern of parameters within a plurality of parameters in the command response, the pattern of parameters includes information defining dimensions of the pattern of parameters.

9. The apparatus in claim 8, the graphical-user-interface further configured to determine the high-level language to generate the code in.

10. The apparatus in claim 9, wherein the high-level language is from at least one of a compiled language or a scripting language, wherein the compiled language includes at least one of C, C++, and Java, and the scripting language includes at least one of PHP and JavaScript.

11. The apparatus in claim 10, further comprising a scenario storage coupled to the computer to store scenario definitions where the scenario information comprises of a plurality of scenario steps and the association of scenario steps with commands, wherein the computer receives associations between a command to a DUT and a scenario step from the graphical-user-interface and stores the association in the scenario storage along with any programmatic code generated for the scenario step.

12. The apparatus in claim 11, the code generator coupled to the computer further configured to generate an executable programmatic code given the command template, response template, and a plurality of rules by:
  a. associating the executable programmatic code with a scenario step within a scenario; and
  b. storing the executable programmatic code in the scenario storage.

13. The apparatus in claim 12, the code generator further configured to perform the determination of the execution platform that the DUT is running on.

14. The apparatus in claim 13, the code generator further configured to determine the selection of the high-level language to generate the programmatic code in based on the platform the DUT is running on, wherein the high level language being supported by the execution platform.

15. A computer readable medium having stored thereon instructions that, when executed by a computer, causes the computer to perform a method for generating programmatic code for a device under test (DUT), the method comprising:
  a. receiving a command selection;
  b. retrieving response template parameters for the command, the response template parameters being retrieved from a response template of the command, wherein the response template further includes a location of a pattern of parameters within a plurality of parameters in the command response, the pattern of parameters includes information defining dimensions of the pattern of parameters; and
  c. generating the programmatic code for the DUT, wherein the programmatic code being generated in a high level language and incorporates programming instructions for verifying command responses.

16. The computer readable medium in claim 15, wherein the generating includes retrieving information of an execution platform.

17. The computer readable medium in claim 16, wherein the selection of a high level language is determined by the information execution platform, wherein the high level language being supported by the execution platform.

18. The computer readable medium in claim 17, wherein the programming instructions to verify comprises programmatic code for comparing command responses.

* * * * *